United States Patent
Song et al.

(10) Patent No.: US 10,430,003 B2
(45) Date of Patent: Oct. 1, 2019

(54) CONDUCTIVE SHEET AND CONDUCTIVE PATTERN

(71) Applicant: DONGWOO FINE-CHEM CO., LTD., Iksan-si, Jeollabuk-do (KR)

(72) Inventors: Byung Hoon Song, Gunpo-si (KR); Dong Ki Keum, Daejeon (KR); Dae Chul Park, Seoul (KR)

(73) Assignee: DONGWOO FINE-CHEM CO.. LTD., Iksan-si (KR)

( * ) Notice: Subject to any disclaimer, the term of this patent is extended or adjusted under 35 U.S.C. 154(b) by 126 days.

(21) Appl. No.: 15/548,740

(22) PCT Filed: Feb. 5, 2016

(86) PCT No.: PCT/KR2016/001314
§ 371 (c)(1),
(2) Date: Aug. 3, 2017

(87) PCT Pub. No.: WO2016/129897
PCT Pub. Date: Aug. 18, 2016

(65) Prior Publication Data
US 2018/0018040 A1 Jan. 18, 2018

(30) Foreign Application Priority Data
Feb. 10, 2015 (KR) .................. 10-2015-0019892

(51) Int. Cl.
*G06F 3/044* (2006.01)
*G06F 3/041* (2006.01)
(Continued)

(52) U.S. Cl.
CPC .............. *G06F 3/044* (2013.01); *G06F 3/041* (2013.01); *H01B 1/02* (2013.01); *H01B 1/124* (2013.01); *H01B 1/22* (2013.01); *G06F 2203/04103* (2013.01); *G06F 2203/04112* (2013.01); *H05K 1/095* (2013.01); *H05K 2201/0108* (2013.01); *H05K 2201/026* (2013.01);
(Continued)

(58) Field of Classification Search
CPC ..................... G06F 3/044; G06F 3/041; G06F 2203/04112; G06F 2203/04103; G06F 2203/10151; H01B 1/02; H01B 1/124; H01B 1/22; H05K 1/095; H05K 2201/0108; H05K 2201/0215; H05K 2201/026; H05K 2201/29681
See application file for complete search history.

(56) References Cited

U.S. PATENT DOCUMENTS

2009/0186276 A1 * 7/2009 Zhamu .................. H01M 4/045
                                                              429/221
2015/0185892 A1 * 7/2015 Chae ........................ G06F 3/041
                                                              345/173

FOREIGN PATENT DOCUMENTS

JP       2011-022659 A    2/2011
KR   10-2012-0033555 A    4/2012
(Continued)

*Primary Examiner* — Shane Fang
(74) *Attorney, Agent, or Firm* — Maschoff Brennan (57) ABSTRACT

A conductive sheet according to an aspect of the present invention includes a first nanostructure and a second nanostructure disposed to intersect each other. A thickness of an intersect region of the first nanostructure and the second nanostructure is 0.6 to 0.9 times the sum of thicknesses of non-intersection regions of the first nanostructure and the second nanostructure.

19 Claims, 11 Drawing Sheets

(51) Int. Cl.
*H01B 1/02* (2006.01)
*H01B 1/12* (2006.01)
*H01B 1/22* (2006.01)
*H05K 1/09* (2006.01)

(52) U.S. Cl.
CPC ............... *H05K 2201/0215* (2013.01); *H05K 2201/09681* (2013.01); *H05K 2201/10151* (2013.01)

(56) References Cited

FOREIGN PATENT DOCUMENTS

| | | |
|---|---|---|
| KR | 10-2013-0048333 A | 5/2013 |
| KR | 10-2013-0112821 A | 10/2013 |
| KR | 10-2014-0003217 A | 1/2014 |

\* cited by examiner

CONDUCTIVE SHEET AND CONDUCTIVE PATTERN

TECHNICAL FIELD

The present invention relates to a conductive sheet and a conductive pattern, and more particularly, to a conductive sheet and a conductive pattern which are capable of improving conductivity.

BACKGROUND ART

Recently, a touch panel has been applied to various electronic products, through which a user input is input by touching an image displayed on a display device with a finger or an input device such as a stylus.

Such touch panels may be largely divided into a resistive-film type touch panel and a capacitive touch panel. A touched position on the resistive-film type touch panel is detected as glass and an electrode are shorted by pressure applied by an input device. A touched position on the capacitive touch panel is detected by sensing a change in a capacitance between electrodes, caused when the touch pad is touched by a finger.

As the resistive-film type touch panel is repeatedly used, the performance of the touch panel may be lowered and the touch panel may be scratched. Thus, much attention has been paid to capacitive touch panels having high durability and long lifetime.

The capacitive touch panel is defined as having an effective region into which a touch command may be input and an ineffective region outside the effective region. In the effective region, an electrode pattern is formed of a transparent conductive material to transmit light from a display device.

Conventionally, the electrode pattern is formed of an indium-tin oxide (ITO). The ITO is limited in terms of a high sheet resistance, high manufacturing costs, and imbalance between the supply and demand of indium in a raw material market. Furthermore, the ITO is not available for a flexible display apparatus which is a recent trend.

Recently, research has been conducted on a transparent electrode material such as silver nanowire which may replace the ITO.

Figure 1:
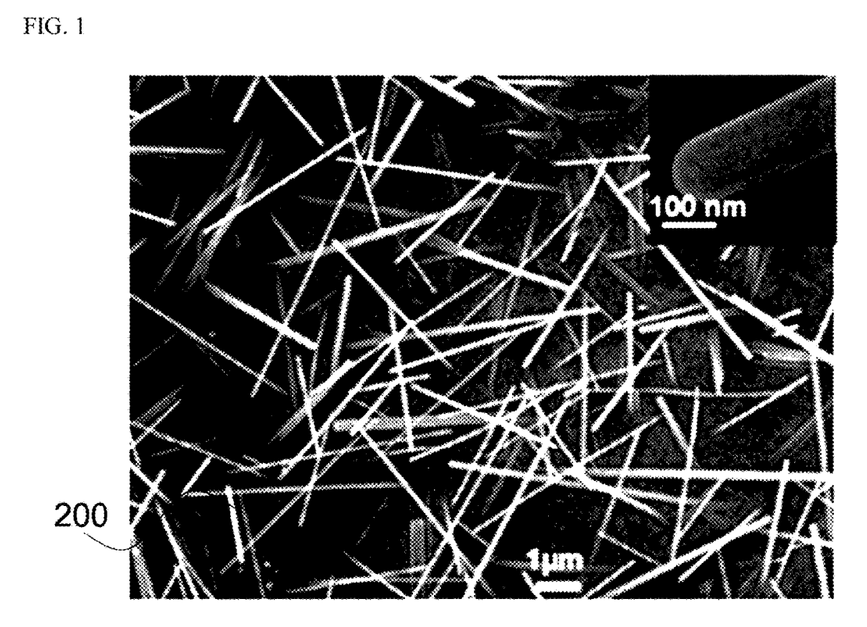
FIG. 1 is a diagram illustrating a transparent electrode formed of conventional silver nanowires.

FIG. 1 is a diagram illustrating a transparent electrode formed of conventional silver nanowires.

Referring to FIG. 1, conventionally, an aspect ratio of silver nanowires 200 is limited due to material and manufacturing process constraints, and the silver nanowires 200 are manufactured each having a small diameter of about 100 nm to achieve high transmissivity. As a result, the silver nanowires 200 having a relatively short length of 5 um to 10 um are applied to a transparent electrode.

The silver nanowires 200 are required to have high conductivity in order to be applied to a transparent electrode. However, the silver nanowires 200 have a short length and thus have low conductivity due to many disconnections between the silver nanowires 200.

Figure 2:
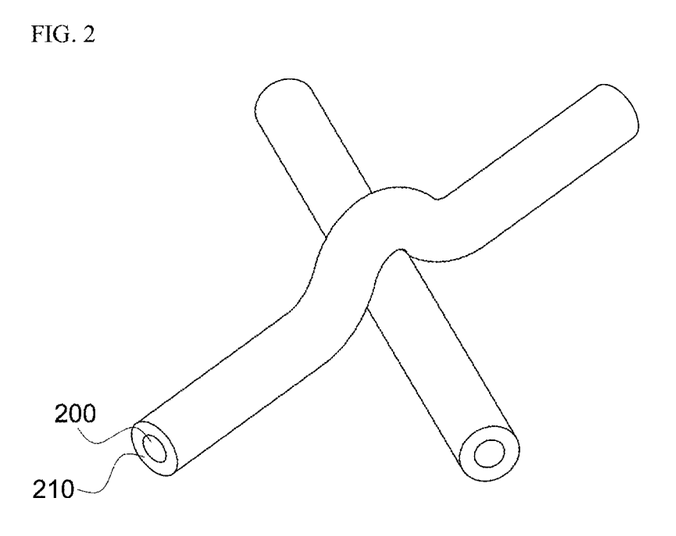
FIG. 2 is an enlarged view of an intersection region of conventional silver nanowires.

Furthermore, as illustrated in FIG. 2, an organic film 210 exists on a surface of each of the silver nanowires 200 and thus a resistance of contact regions between the silver nanowires 200 increases. In addition, an additional process should be performed to electrically connect the silver nanowires 210, thereby increasing manufacturing costs.

DISCLOSURE

Technical Problem

The present invention is directed to a conductive sheet and a conductive pattern, which are capable of maintaining optical transmissivity constant and improving conductivity.

The present invention is also directed to a conductive sheet and a conductive pattern, which are capable of reducing manufacturing costs.

Aspects of the present invention are not limited thereto, and additional aspects will be apparent to those of ordinary skill in the art from the following description and the appended drawings.

Technical Solution

One aspect of the present invention provides a conductive sheet including a first nanostructure and a second nanostructure disposed to intersect each other. A thickness of an intersection region of the first nanostructure and the second nanostructure is 0.6 to 0.9 times the sum of thicknesses of non-intersection regions of the first nanostructure and the second nanostructure.

Another aspect of the present invention provides a conductive pattern including at least one unit conductive pattern forming a touch pixel. The conductive pattern includes a first nanostructure and a second nanostructure disposed to intersect each other in the at least one unit conductive pattern. A thickness of an intersection region of the first nanostructure and the second nanostructure is 0.6 to 0.9 times the sum of thicknesses of non-intersection regions of the first nanostructure and the second nanostructure.

Aspects of the present invention are, however, not limited thereto, and additional aspects will be apparent to those of ordinary skill in the art from the following description and the appended drawings.

Advantageous Effects

According to the present invention, nanostructures of a conductive sheet and a conductive pattern are formed to be long by electro-spinning and thus an intersection region between the nanostructures may be increased to improve conductivity.

Furthermore, according to the present invention, the intersection region between the nanostructures of the conductive sheet and the conductive pattern is formed during removing of a polymer. Thus, an additional process may be skipped and thus manufacturing costs may be decreased.

Effects of the present invention are not, however, limited thereto, and additional effects will be apparent to those of ordinary skill in the art from the following description and the appended drawings.

MODES OF THE INVENTION

Embodiments set forth herein are provided to clearly explain the idea of the present invention to those of ordinary skill in the technical field to which the invention pertains. Thus, the present invention is not limited by these embodiments. The scope of the present invention should be understood to include changed examples or modified examples which fall within the idea of the present invention.

In the present disclosure, general terms that have been widely used nowadays are selected, if possible, in consideration of functions of the present invention, but non-general terms may be selected according to the intentions of those of ordinary skill in the art, precedents, or new technologies, etc. Also, some terms may be arbitrarily chosen by the present applicant. In this case, the meanings of these terms will be explained in corresponding parts of the present disclosure in detail. Thus, the terms used herein should be defined not based on the names thereof but based on the meanings thereof and the whole context of the present invention.

The appended drawings are provided to easily explain the present invention, in which the shape of each of elements may be exaggerated for clarity. Thus, the present invention should not be construed as being limited thereby.

In the following description, well-known functions or constructions are not described in detail if it is determined that they would obscure the invention due to unnecessary detail.

A conductive sheet according to one embodiment of the present invention includes a first nanostructure and a second nanostructure disposed to intersect each other. A thickness of an intersection region of the first nanostructure and the second nanostructure is 0.6 to 0.9 times the sum of thicknesses of non-intersection regions of the first nanostructure and the second nanostructure.

The conductive sheet may include a matrix including first nanostructure and the second nanostructure. The matrix may be in direct contact with the first nanostructure and the second nanostructure.

The first nanostructure and the second nanostructure may be electrically connected to each other via the intersection region.

The first nanostructure and the second nanostructure may be each formed by spinning a mixed solution of a metal material and a polymer. The intersection region may be formed by removing the polymer after the spinning of the mixed solution.

A width of the intersection region may be 1.2 to 1.8 times greater than that of the non-intersection region.

The first nanostructure and the second nanostructure may each have an aspect ratio of 100,000 or more.

The first nanostructure and the second nanostructure may be formed by electro-spinning.

The first nanostructure may have the same cross-sectional area in the intersection region and the non-intersection regions.

A conductive pattern according to another aspect of the present invention includes at least one unit conductive pattern forming a touch pixel. The conductive pattern includes a first nanostructure and a second nanostructure disposed to intersect each other in the at least one unit conductive pattern. A thickness of an intersection region of the first nanostructure and the second nanostructure is 0.6 to 0.9 times the sum of thicknesses of non-intersection regions of the first nanostructure and the second nanostructure.

The first nanostructure may include a first end and a second end. The first end may meet a first side surface of the conductive pattern at a first point. The second end may meet a second side surface of the conductive pattern at a second point. The distance between the first point and the second point may be shorter than a length of the first nanostructure.

The first side surface and the second side surface may be adjacent to each other.

The first side surface and the second side surface may face each other.

The conductive pattern may include a matrix including the first nanostructure and the second nanostructure. The matrix may be in direct contact with the first nanostructure and the second nanostructure.

The first nanostructure and the second nanostructure may be electrically connected to each other at the intersection region.

The first nanostructure and the second nanostructure may be formed by spinning a mixed solution of a metal material and a polymer. The intersection region may be formed by removing the polymer after the spinning of the mixed solution.

A width of the intersection region may be 1.2 to 1.8 times greater than those of the non-intersection regions.

The first nanostructure and the second nanostructure may be formed by electro-spinning.

The first nanostructure may have the same cross-sectional area in the intersection region and the non-intersection regions.

The first nanostructure may meet a straight line, which connects the first point and the second point, at at least one point.

A conductive sheet according to an embodiment of the present invention will be described below.

Figure 3:
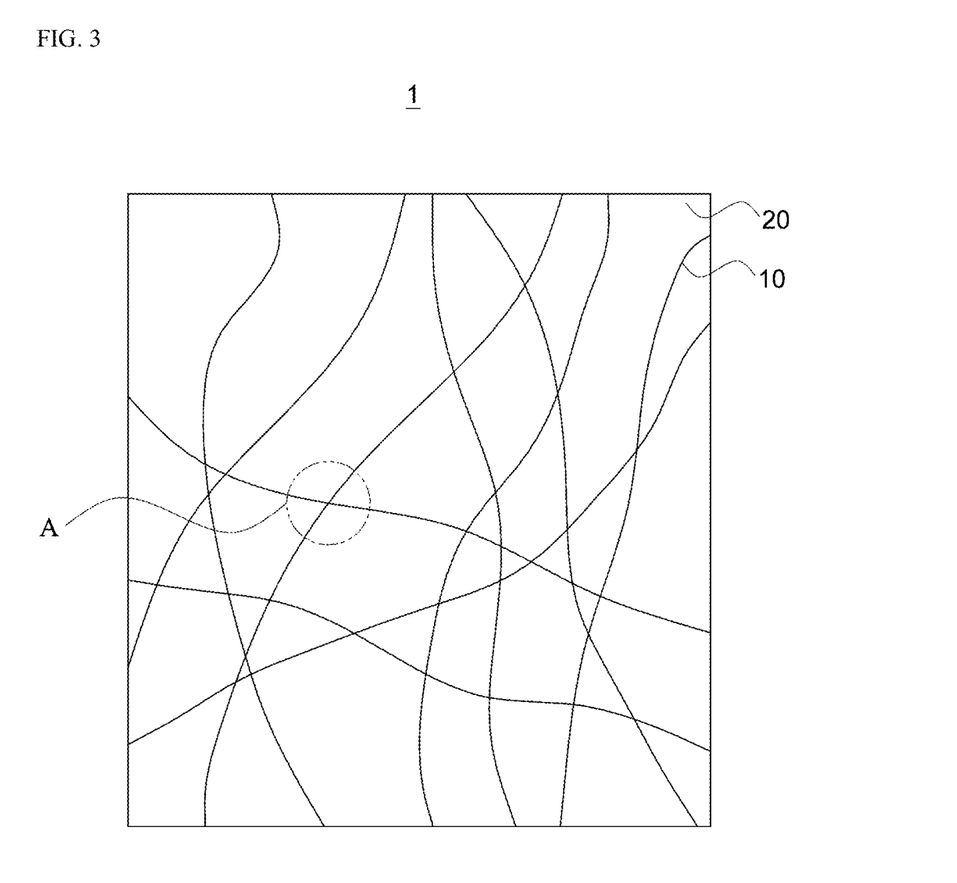
FIG. 3 is a top view of a conductive sheet according to an embodiment.

FIG. 3 is a top view of a conductive sheet according to an embodiment.

Referring to FIG. 3, a conductive sheet 1 according to an embodiment may include a plurality of nanostructures 10 and a matrix 20.

The nanostructures 10 may be nanofibers having an aspect ratio of 100,000 or more. The nanostructures 10 may have a width of 1 um or less.

The nanostructures 10 may include a metal material. Examples of the metal material may include silver, gold, copper, nickel, gold-plated silver, platinum, and palladium. When the nanostructures 10 include silver, the nanostructures 10 may be defined as silver nanostructures. Alternatively, the nanostructures 10 may be formed of only a metal material.

The nanostructures 10 are formed as having a small width and cannot be thus viewed with a naked eye. The conductive sheet 1 including the nanostructures 10 is guaranteed having high optical transmissivity.

The matrix 20 is referred to as a solid-state material forming a main body of the conductive sheet 1, in which the nanostructures 10 are dispersed or included therein.

The matrix 20 may protect the nanostructures 10 from the outside. The matrix 20 may prevent the nanostructures 10 from being oxidized. The matrix 20 may provide adhesive strength when the conductive sheet 1 is attached to a member such as a substrate.

The nanostructures 10 may be in direct contact with the matrix 20. That is, outer surfaces of the nanostructures 10 may be in direct contact with the matrix 20.

The matrix 20 may include a conductive polymer. When the matrix 20 includes the conductive polymer, the matrix 20 may provide a charge moving path. When the matrix 20 provides the charge moving path and thus the conductive sheet 1 is used as an electrode, the matrix 20 may serve as an auxiliary electrode.

The conductive polymer may include, but is not limited to, polyacetylene, polythiophene, polypyrrole, polyparaphenylene, polyparaphenylene vinylene, PEDOT:PSS, carbon nanotubes, or the like.

The nanostructures 10 are formed in a long structure having an aspect ratio of 100,000 or more. Thus, each of the nanostructures 10 may have a plurality of points of intersection, such as a region A, with the other nanostructures 10.

Figure 4A:
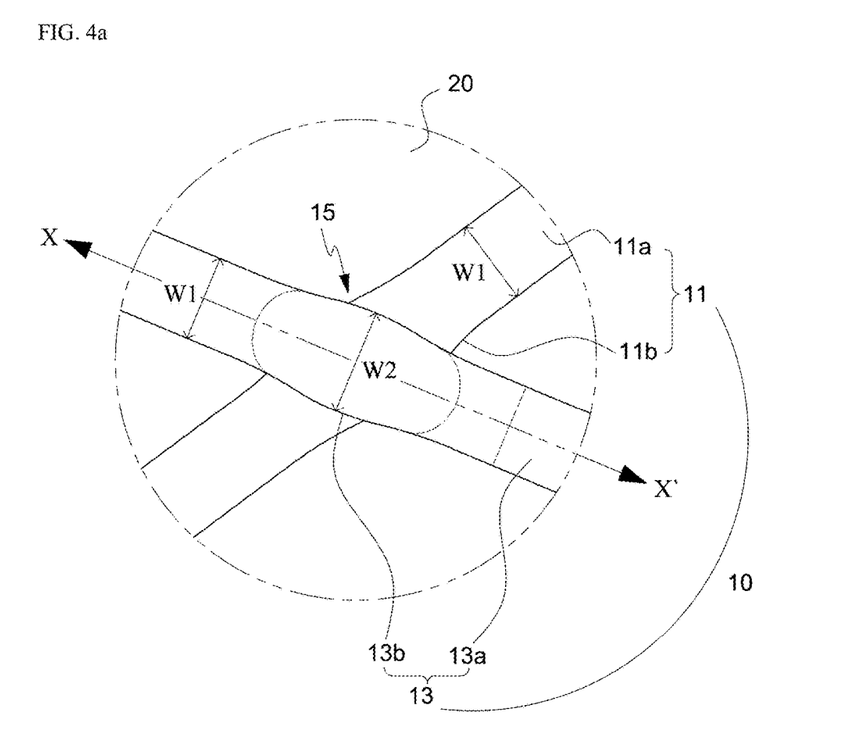
FIG. 4 is an enlarged view of a region A of FIG. 3.
Figure 4B:
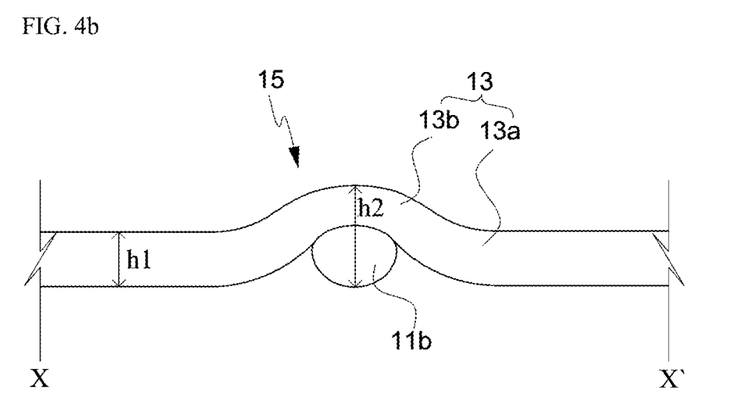

FIG. 4 is an enlarged view of the region A of FIG. 3. FIG. 4A is a top view of the region A of FIG. 3. FIG. 4B is a cross-sectional view taken along line X-X' of FIG. 4A.

Referring to FIG. 4, the plurality of nanostructures 10 according to an embodiment may include a first nanostructure 11 and a second nanostructure 13. The nanostructures 10 may be formed in a cylindrical shape.

The first nanostructure 11 may intersect the second nanostructure 13. Regions of the first nanostructure 11 and the second nanostructure 13 intersect each other may be defined together as an intersection region 15.

The first nanostructure 11 may include a first non-intersection region 11a and a first intersection region 11b. The second nanostructure 13 may include a second non-intersection region 13a and a second intersection region 13b.

The first intersection region 11b and the second intersection region 13b are the regions of the first nanostructure 11 and the second nanostructure 13 which intersect each other, and form the intersection region 15 together. The first nanostructure 11 and the second nanostructure 13 are electrically connected to each other at the intersection region 15. That is, the first intersection region 11b and the second intersection region 13b are electrically connected to each other.

The first non-intersection region 11a and the second non-intersection region 13a may have the same width. The first non-intersection region 11a and the second non-intersection region 13a may have the same thickness. That the first non-intersection region 11a and the second non-intersection region 13a may have the same width and the same thickness may be understood to include not only a case in which the widths and thicknesses thereof are the same but also a case in which although the widths and thicknesses of the first non-intersection region 11a and the second non-intersection region 13a are designed to be the same, the widths or thicknesses thereof become different from each other within an error range during a process.

The first non-intersection region 11a and the second non-intersection region 13a may be formed to a first width w1. The first non-intersection region 11a and the second non-intersection region 13a may be formed to a first thickness h1.

The intersection region 15 may be formed to a thickness which is less than the sum of the thicknesses of the first non-intersection region 11a and the second non-intersection region 13a. That is, the intersection region 15 may be formed to a second thickness h2 which is less than the double of the first thickness h1.

The intersection region 15 may be formed to a width which is greater than the width of the first non-intersection region 11a and the width of the second non-intersection region 13a. That is, the first intersection region 11b and the second intersection region 13b may be formed to a second width w2 which is greater than the first width w1.

The thickness of the intersection region 15 decreases when the first intersection region 11b and the second intersection region 13b are in contact with each other, and the width of the intersection region 15 increases as the thickness thereof decreases.

The first intersection region 11b may have a smaller thickness and a larger width than those of the first non-intersection region 11a but may have the same cross-sectional area as that of the first non-intersection region 11a. That is, the area of a cross section of the first intersection region 11b which is cut at a certain point thereon in a direction of the first thickness h1 may be the same as that of a cross section of the first non-intersection region 11a which is cut at a certain point thereon in a direction of the second thickness h2.

In conclusion, all regions of the first nanostructure 11 including the first intersection region 11b and the first non-intersection region 11a may have the same cross-sectional area. That all the regions of the first nanostructure 11 may have the same cross-sectional area may be understood to include not only a case in which a cross-sectional area of the first intersection region 11b and a cross-sectional area of the first non-intersection region 11a have the same numerical value but also a case in which although the cross-sectional area of the first intersection region 11b and the cross-sectional area of the first non-intersection region 11a are designed to have the same value, the cross-sectional areas thereof become different from each other within an error range during a process. When a direction indicated by a line X-X' is a lengthwise direction of the first nanostructure 11 and the first nanostructure 11 is divided by an equal length, regions divided from the first nanostructure 11 may have the same volume. That is, when the first intersection region 11b is divided by a certain length and the first non-intersection region 11a is divided by the certain length, a part divided from the first intersection region 11b and a part divided from the first non-intersection region 11a may have the same volume.

The second intersection region 13b may have a smaller thickness and a large width than those of the second non-intersection region 13a but may have the same cross-sectional area as that of the second non-intersection region 13a. That is, the area of a cross section of the second intersection region 13b which is cut at a certain point thereon in the direction of the second thickness h2 may be the same as that of a cross section of the second non-intersection region 13a which is cut at a certain point thereon in the direction of the second thickness h2.

In conclusion, all regions of the second nanostructure 13 including the second intersection region 13b and the second non-intersection region 13a may have the same cross-sectional area. That all the regions of the second nanostructure 13 may have the same cross-sectional area may be understood to include not only a case in which a cross-sectional area of the second intersection region 13b and a cross-sectional area of the second non-intersection region 13a have the same numerical value but also a case in which although the cross-sectional area of the second intersection region 13b and the cross-sectional area of the second non-intersection region 13a are designed to have the same value, the cross-sectional areas thereof become different from each other within an error range during a process.

When a direction in which the second nanostructure 13 extends is a lengthwise direction thereof and the second nanostructure 13 is divided by an equal length, regions divided from the second nanostructure 13 may have the same volume. That is, when the second intersection region 13b is divided by a certain length and the second non-intersection region 13a is divided by the certain length, a part divided from the second intersection region 13b and a part divided from the second non-intersection region 13a may have the same volume.

Figure 5:
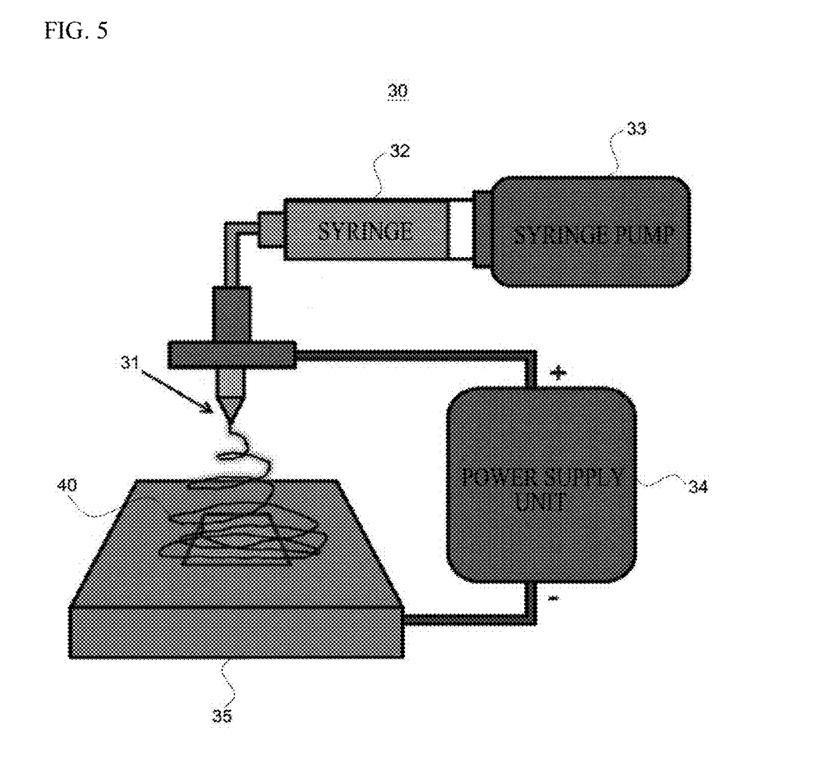
FIG. 5 is a diagram illustrating a field emission device according to an embodiment.

FIG. 5 is a diagram illustrating a field emission device according to an embodiment.

Referring to FIG. 5, a field emission device 30 according to an embodiment includes a nozzle 31, a syringe 32, a syringe pump 33, a power supply unit 34, and a collector 35.

The nozzle 31 may be connected to the syringe 32. The syringe 32 may be connected to the syringe pump 33. A spinning solution is injected into the syringe 32. The syringe pump 33 applies pressure to the syringe 32. The spinning solution injected into the syringe 32 may be transferred to the nozzle 31 due to the pressure applied by the syringe pump 33.

The spinning solution may include a metal material and a polymer. The spinning solution may be a mixed solution of the metal material and the polymer.

The syringe pump 33 may adjust pressure to be applied to the syringe 32 to spray a constant amount of the spinning solution via the nozzle 31.

The power supply unit 34 may be electrically connected to the nozzle 31 and the collector 35, and apply a voltage to the nozzle 31 and the collector 35.

When the power supply unit 34 applies the voltage to the nozzle 31 and the collector 35, an electric field is formed between the nozzle 31 and the collector 35. When the intensity of the electric field is the same as a surface tension of the spinning solution, an end part of the nozzle 31 is covered with the spinning solution having electric charge.

In this case, when a voltage greater than or equal to the surface tension of the spinning solution is applied, nanofibers 40 are sprayed in a direction of the collector 35 which is a ground-voltage direction. The above method of forming the nanofibers 40 is referred to as electro-spinning.

Although electro-spinning has been described above as an example of a method of forming the nanofibers 40 in one embodiment, the present invention is not limited thereto.

The nanofibers 40 having a small width and a high aspect ratio may be formed by controlling, by the electro-spinning, a voltage to be applied by the power supply unit 34 and pressure to be applied by the syringe pump 33.

The nanofibers 40 formed by the electro-spinning may include the metal material and the polymer.

Thereafter, the nanostructures 10 including only the metal material of FIGS. 3 and 4 may be formed by removing the polymer from the nanofibers 40.

The optical transmissivity of the conductive sheet 1 may be improved by forming the nanostructures 10 having a small width through the above process.

Furthermore, since the nanostructures 10 having a high aspect ratio, i.e., the nanostructures 10 which are long, may be formed, the number of intersecting nanostructures 10 per unit number of nanostructures 10 increases. As the number of intersecting nanostructures 10 per unit number of nanostructures 10 increases, the number of charge moving paths between the nanostructures 10 increases. Accordingly, the conductivity of the entire conductive sheet 1 may be improved. That is, the number of points of intersection at which different nanostructures 10 are electrically connected to one another increases and thus the conductivity of the entire conductive sheet 1 may be improved.

The polymer may be removed from the nanofibers 40 through heat treatment.

During the removing of the polymer from the nanofibers 40, the first nanostructure 11 and the second nanostructure 13 may be electrically connected to each other at the intersection region 15. That is, portions of the first intersection region 11b and the second intersection region 13b may be melted by heat applied during the removing of the polymer and thus the widths of the first intersection region 11b and the second intersection region 13b may be greater than those of the first non-intersection region 11a and the second non-intersection region 13a. While the portions of the first intersection region 11b and the second intersection region 13b are melted by the heat applied during the removing of the polymer and then hardens, the first intersection region 11b and the second intersection region 13b may integrally harden. As the first intersection region 11b and the second intersection region 13b integrally harden, the intersection region 15 may have electrical conductivity which is substantially the same as that of the non-intersection regions 11a and 13a.

The widths of the first intersection region 11b and the second intersection region 13b may be 1.2 to 1.8 times greater than those of the first non-intersection region 11a and the second non-intersection region 13a.

Furthermore, the intersection region 15 may be formed to a thickness which is less than the sum of the thicknesses of the first non-intersection region 11a and the second non-intersection region 13a due to the heat applied during the removing of the polymer.

The thickness of the intersection region 15 may be 0.6 to 0.9 times the sum of the thicknesses of the first non-intersection region 11a and the second non-intersection region 13a.

When the intersection region 15 has a width which is 1.2 to 1.8 times greater than those of the non-intersection regions 11a and 13a and has a thickness which is 0.6 to 0.9 times the sum of the thicknesses of the non-intersection regions 11a and 13a, a contact area between the intersecting nanostructures 10 increases. Thus, the mobility of charges between the intersecting nanostructures 10 may be smooth and thus contact resistance decreases. As contact resistance between the intersecting nanostructures 10 decreases, the conductivity of the entire conductive sheet 1 may be improved. Furthermore, a contact area between the nanostructures 10 increases, thereby improving the stability of the conductive sheet 1.

That is, while portions of the intersecting nanostructures 10 are melted and harden, a binding force between the first intersection region 11b and the second intersection region 13b increases and some of the nanostructures 10 may be prevented from being separated due to external shocks.

When the intersection region 15 is formed to a thickness which is 0.9 times greater than the sum of the thicknesses of the non-intersection regions 11a and 13a, the effect of decreasing contact resistance is low and thus the effect of improving conductivity is low.

In one embodiment, since the effect of improving the conductivity of the conductive sheet 1 may be achieved through the removing of the polymer, conductivity may be improved more easily than a process of processing an intersection region of silver nanowires having an organic film on surfaces thereof. Thus, manufacturing costs may be reduced. Furthermore, the removing of the polymer and the processing of the intersection region may be simultaneously performed through one process, thereby increasing manufacturing yield.

An additional process of processing an intersection region should be performed after the removing of the polymer so that the intersection region 15 may be formed to a thickness which is 0.6 times less than the sum of the thicknesses of the non-intersection regions 11a and 13a. In this case, the additional process is added and thus manufacturing costs increase and manufacturing yield decreases.

Accordingly, the intersection region 15 may be formed to a thickness which is 0.6 to 0.9 times the sum of the thicknesses of the non-intersection regions 11a and 13a to improve conductivity, decrease manufacturing costs, and increase manufacturing yield.

FIG. 6 is a diagram illustrating examples of a part of an electrode pattern according to embodiments.

Although only one nanostructure formed in a part of the electrode pattern is illustrated and remaining nanostructures are not illustrated in FIG. 6, a plurality of nanostructures are actually formed in the part of the electrode pattern.

Referring to FIG. 6, an electrode pattern 51 may be formed by patterning the conductive sheet 1. The electrode pattern 51 may be formed by patterning the conductive sheet 1 through a photolithographic process. Since the electrode pattern 51 is formed by patterning the conductive sheet 1, the electrode pattern 51 may include the nanostructures 10 and the matrix 20.

The electrode pattern 51 may have a tetragonal shape. The electrode pattern 51 may have a first side surface 51a, a second side surface 51b, a third side surface 51c, and a fourth side surface 51d. The first side surface 51a is defined as a surface facing the third side surface 51c. The second side surface 51b is defined as a surface facing the fourth side surface 51d. The second side surface 51b is a surface adjacent to the first side surface 51a and the third side surface 51c. The fourth side surface 51d is a surface adjacent to the first side surface 51a and the third side surface 51c. Although the electrode pattern 51 is illustrated as having a tetragonal shape in the drawings, the electrode pattern 51 may have various shapes other than the tetragonal shape and is thus not limited to the tetragonal shape.

Since the matrix 20 forms a main body of the conductive sheet 1, the first to fourth side surfaces 51a to 51d may be cross sections patterned by the photolithographic process.

Similarly, the nanostructures 10 may have cross sections patterned by the photolithographic process. That is, the nanostructures 10 which pass the surfaces patterned by the photolithographic process may be also patterned and thus has cross sections.

The nanostructure 10, the opposite ends of which are patterned among the nanostructures 10 may include a first end 10a and a second end 10b which are in contact with side surfaces of the electrode pattern 51. The first end 10a and the second end 10b meet side surfaces of the electrode pattern 51 at a first point P and a second point Q, respectively.

Figure 6A:
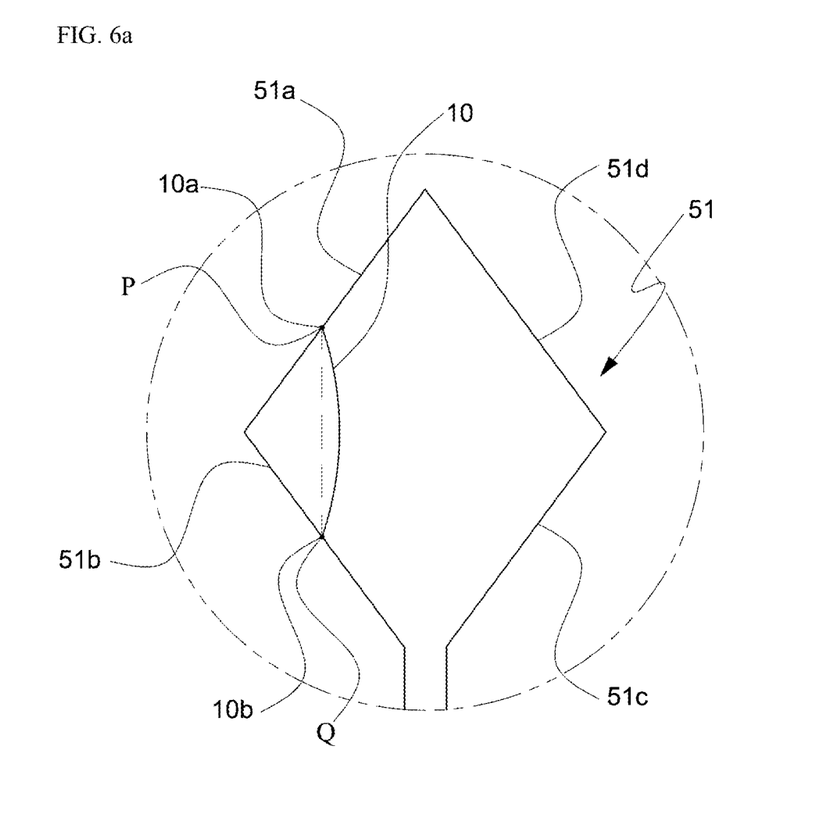
FIG. 6 is a diagram illustrating examples of a part of an electrode pattern according to embodiments.

For example, in FIG. 6A, the first point P may be located on the first side surface 51a and the second point Q may be located on the second side surface 51b. That is, the first end 10a of the nanostructure 10 may meet the first side surface 51a at the first point P, and the second end 10b of the nanostructure 10 may meet the second side surface 51b at the second point Q. In other words, the first end 10a and the second end 10b of the nanostructure 10 may respectively meet the first side surface 51a and the second side surface 51b of the electrode pattern 51 adjacent thereto.

The distance between the first point P and the second point Q is shorter than a length of the nanostructure 10 having the first end 10a and the second end 10b. Since it is unlikely that the nanostructure 10 has a straight-line shape, the distance between the first point P and the second point Q is shorter than the length of the nanostructure 10 having the first end 10a and the second end 10b. As another example, in FIG. 6B, the first point P may be located on the first side surface 51a and the second point Q may be located on the third side surface 51c. That is, the first end 10a of the nanostructure 10 may meet the first side surface 51a at the first point P and the second end 10b of the nanostructure 10 may meet the third side surface 51c at the second point Q. In other words, the first end 10a and the second end 10b of the nanostructure 10 may respectively meet the first side surface 51a and the third side surface 51c of the electrode pattern 51 facing each other.

Figure 6B:
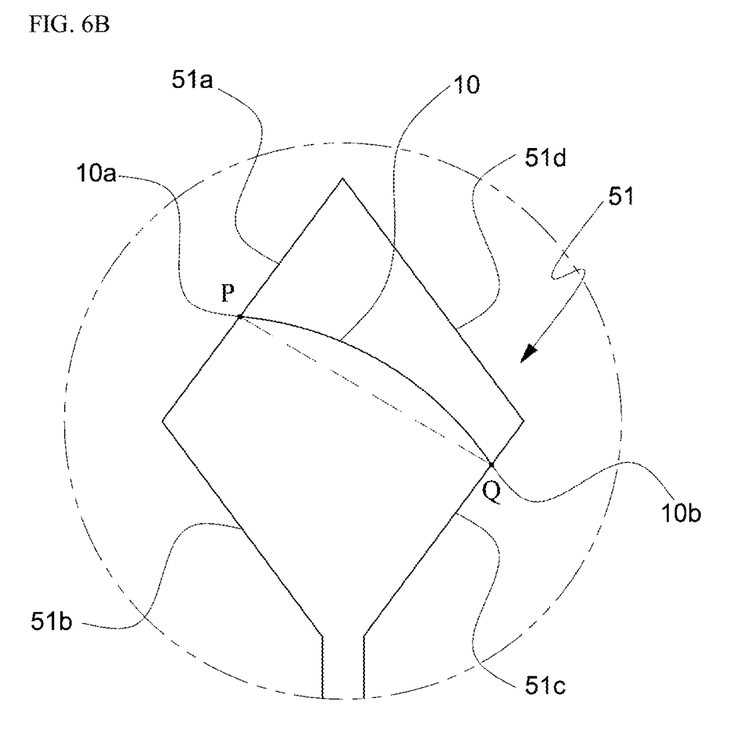

The distance between the first point P and the second point Q is shorter than the length of the nanostructure 10 having the first end 10a and the second end 10b. Since it is unlikely that the nanostructure 10 has a straight-line shape, the distance between the first point P and the second point Q is shorter than the length of the nanostructure 10 having the first end 10a and the second end 10b.

Since the nanostructure 10 has a high aspect ratio and is thus long, the nanostructure 10 may have the first end 10a and the second end 10b which meet different side surfaces of the electrode pattern 51.

Although not shown, a straight line connecting the first point P and the second point Q may cross the nanostructure 10. That is, when the straight line connecting the first point P and the second point Q is drawn, the straight line and the nanostructure 10 may intersect each other at at least one point. The at least one point may include a point other than the first point P and the second point Q.

Since the nanostructure 10 may have an arbitrary curved shape, the nanostructure 10 may have a region located between the first end 10a and the second end 10b and intersecting the straight line between the first point P and the second point Q. The straight line between the first point P and the second point Q may be a virtual line.

The number of intersecting nanostructures 10 per unit number of nanostructures 10 may be increased by forming the nanostructure 10 to be long. As the number of intersecting nanostructures 10 per unit number of nanostructures 10 is increased, the number of charge moving paths between the nanostructures 10 increases and thus the conductivity of the electrode pattern 51 may be improved.

Figure 7:
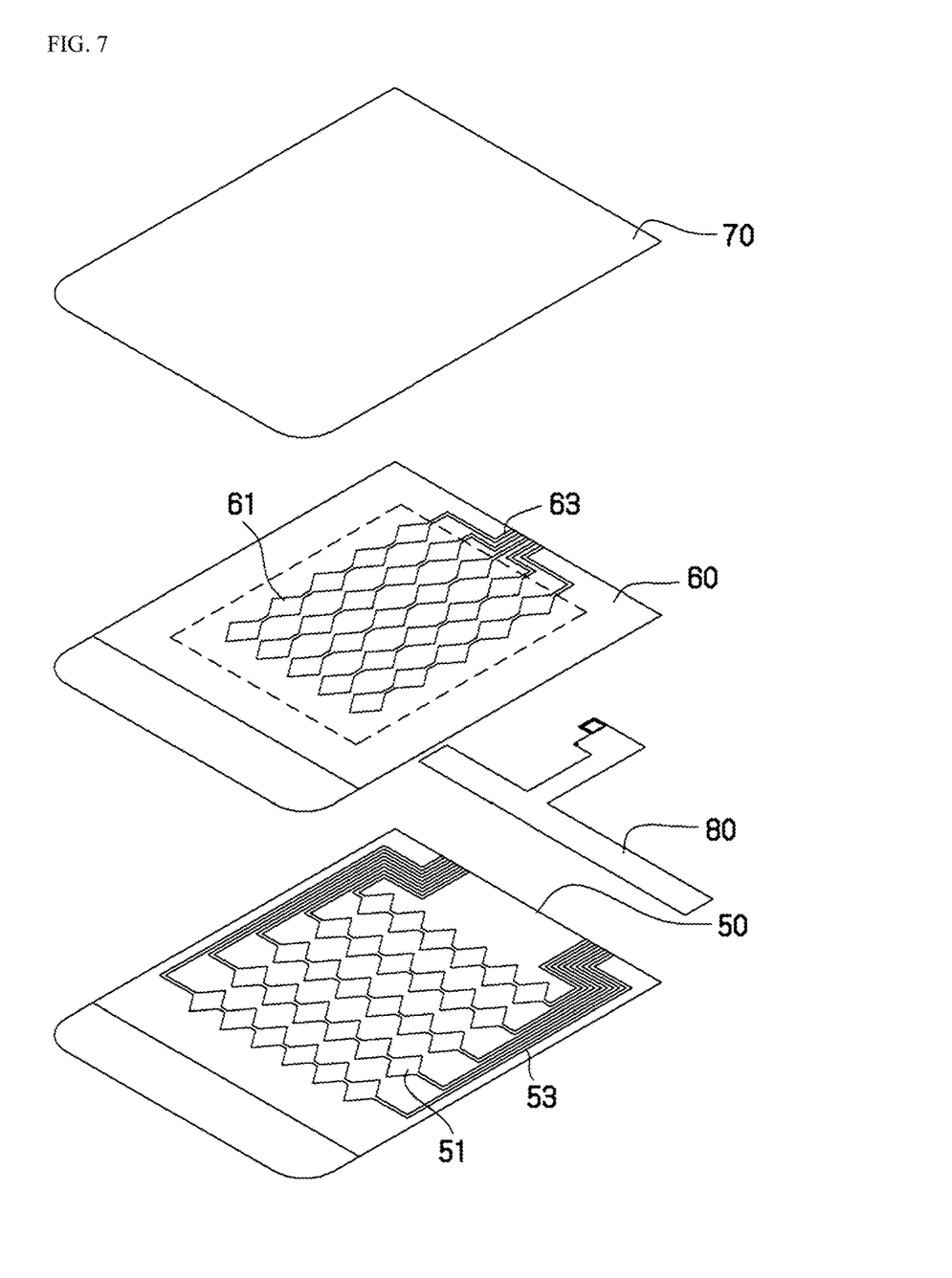
FIG. 7 is an exploded perspective view of a touch panel according to an embodiment.
Figure 8:
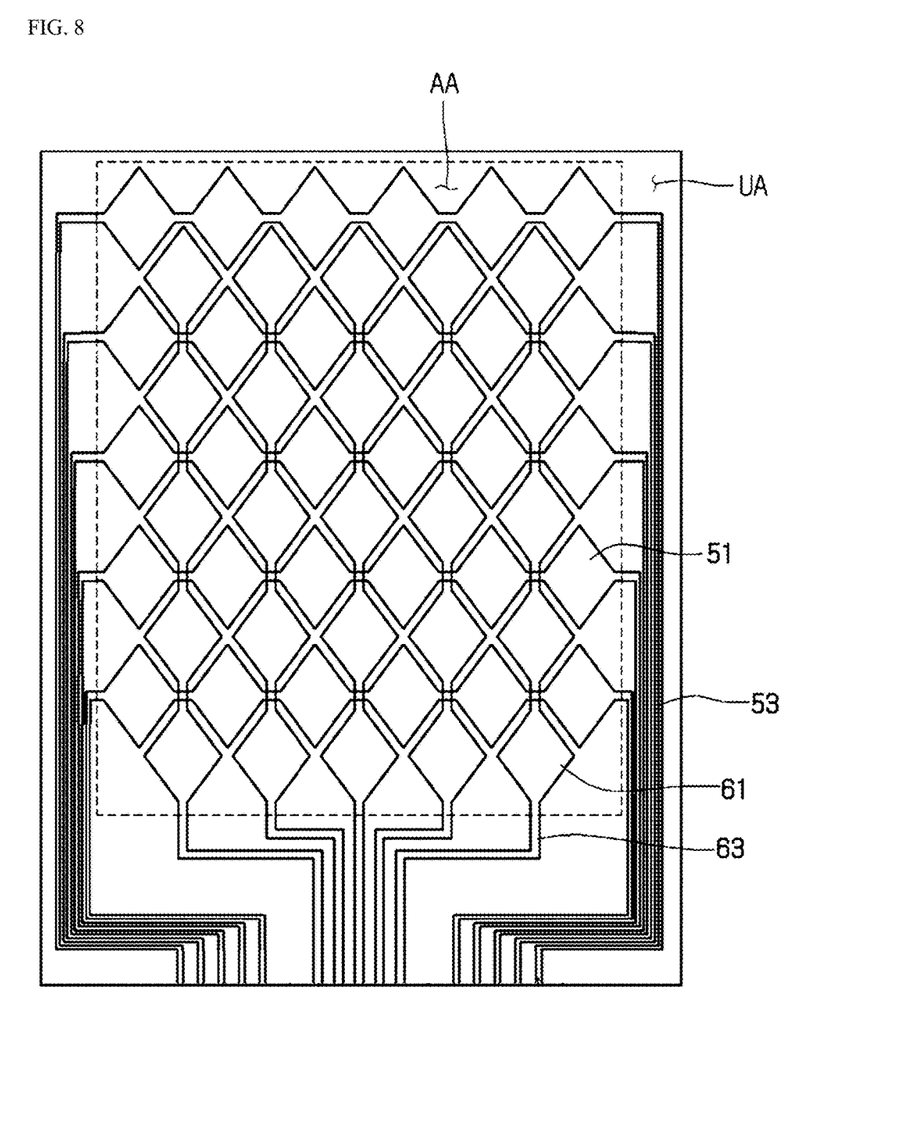
FIG. 8 is a top view of a touch panel according to an embodiment.

FIG. 7 is an exploded perspective view of a touch panel according to an embodiment. FIG. 8 is a top view of a touch panel according to an embodiment.

Referring to FIGS. 7 and 8, a touch panel according to an embodiment may include a first substrate 50, a second substrate 60, a cover substrate 70, and a printed circuit board 80.

The second substrate 60 is located below the cover substrate 70. The first substrate 50 is located below the second substrate 60.

The cover substrate 70 may be attached to the second substrate 60. The cover substrate 70 and the second substrate 60 may be adhered to each other using an adhesive substance such as an optical clear adhesive (OCA).

The first substrate 50 may be attached to the second substrate 60. The first substrate 50 and the second substrate 60 may be adhered to each other using an adhesive substance such as the OCA.

The first substrate 50 and the second substrate 60 may include plastic such as polyethylene terephthalate (PET).

Electrode patterns and wire patterns may be formed on the first substrate 50 and the second substrate 60.

A first electrode pattern 51 and a first wire pattern 53 may be formed on the first substrate 50. A second electrode pattern 61 and a second wire pattern 63 may be formed on the second substrate 60.

The first electrode pattern 51 may be formed in a first direction. The first electrode pattern 51 may be electrically connected to the first wire pattern 53.

The second electrode pattern 61 may be formed in a second direction. The second direction may cross the first direction. The second electrode pattern 61 may be formed in a direction crossing the first electrode pattern 51. The second electrode pattern 61 may be electrically connected to the second wire pattern 63.

The touch panel may include an effective region AA and an ineffective region UA.

The effective region AA may be understood as a region to which a touch command may be input by a user. The ineffective region UA may be understood as a region which is located outside the effective region AA and to which a touch command is not input since this region is not activated even when it is touched by the user.

When the touch panel is used while being attached to a display panel, the effective region AA and the ineffective region UA of the touch panel may respectively correspond to a display region and a non-display region of the display device. An image is displayed in the display region. No image is displayed in the non-display region. Thus, the effective region AA of the touch panel may include a region which transmits light. The ineffective region UA of the touch panel may include a region which does not transmit light.

A plurality of electrode patterns may be formed in the effective region AA. A plurality of first electrode patterns 51 may be formed in the effective region AA of the first substrate 50. A plurality of second electrode patterns 61 may be formed in the effective region AA of the second substrate 60.

A plurality of wire patterns may be formed in the ineffective region UA. A plurality of first wire patterns 53 may be formed in the ineffective region UA of the first substrate 50. A plurality of second wire patterns 63 may be formed in the ineffective region UA of the second substrate 60.

The first electrode pattern 51 may be electrically connected to the first wire pattern 53. The first electrode pattern 51 may be integrally formed with the first wire pattern 53. Alternatively, the first electrode pattern 51 may be formed separately from the first wire pattern 53.

The second electrode pattern 61 may be electrically connected to the second wire pattern 63. The second electrode pattern 61 may be integrally formed with the second wire pattern 63. Alternatively, the second electrode pattern 61 may be formed separately from the second wire pattern 63.

The first electrode pattern 51 and the second electrode pattern 61 may be substantially the same as the electrode patterns illustrated in FIG. 6. The first electrode pattern 51 and the second electrode pattern 61 may be an assembly of the unit electrode patterns illustrated in FIG. 6. That is, the first electrode pattern 51 and the second electrode pattern 61 may have a structure in which a plurality of unit electrode patterns are connected to one another. The first electrode pattern 51 and the second electrode pattern 61 may form one touch pixel including at least one among the plurality of unit conductive patterns.

Although the first electrode pattern 51 has been described as an example above with reference to FIG. 6, the second electrode pattern 61 may have the same shape as the first electrode pattern 51. That is, the first electrode pattern 51 and the second electrode pattern 61 may include nanostructures and a matrix. As described above, since the nanostructures have a high aspect ratio and are thus long, an electrode pattern having high conductivity may be provided. When the first electrode pattern 51 and the second electrode pattern 61 have high conductivity, resistive-capacitive (RC) delay may decrease and thus distortion of signals transmitted using the first electrode pattern 51 and the second electrode pattern 61 may be prevented. Thus, the sensitivity and reliability of a touch sensed by the touch panel may be improved.

Although these electrode patterns are illustrated as being connected in a diamond shape in the drawings, embodiments are not limited thereto and the electrode patterns may be formed in various shapes, e.g., a bar shape.

The cover substrate 70 may include glass or plastic. The cover substrate 70 may include tempered glass, semi-tempered glass, soda-lime glass, reinforced plastic, or soft plastic.

The printed circuit board 80 may be attached to the first substrate 50 and the second substrate 60. The printed circuit board 80 may be attached to one side of each of the first substrate 50 and the second substrate 60. The printed circuit board 80 may be attached to the one side of each of the first substrate 50 and the second substrate 60 to be electrically connected to the first wire pattern 53 and the second wire pattern 63. An anisotropic conductive film (ACF) may be applied onto the one side of each of the first substrate 50 and the second substrate 60 attached to the printed circuit board 80. The printed circuit board 80 may apply a voltage to the first wire pattern 53 and the second wire pattern 63 through the ACF.

The printed circuit board 80 may be a flexible printed circuit board (FPCB). The printed circuit board 80 may include a controller which receives a sensing signal from the first and second electrode patterns 51 and 61 via the first and second wire patterns 53 and 63 and controls the sensing signal.

The controller may receive the sensing signal which is not distorted and perform an operation on the sensing signal to detect a touch. Thus, a process of compensating for a distorted signal may be skipped and a touch may be detected by performing an operation more quickly.

Figure 9:
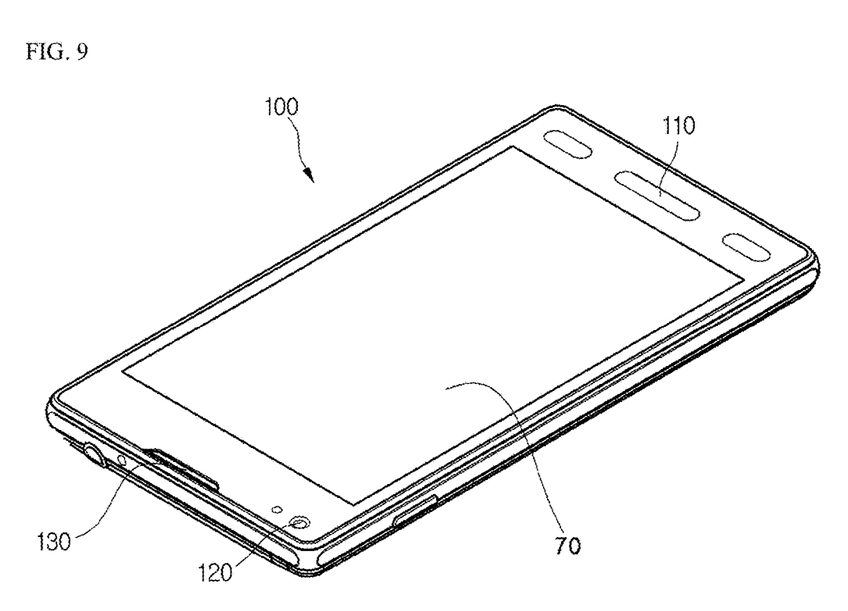
FIG. 9 is a perspective view of a display device to which a touch panel is applied, according to an embodiment.

FIG. 9 is a perspective view of a display device to which a touch panel is applied, according to an embodiment.

Referring to FIG. 9, a display device 100 may include an input button 110 to which a command is input from the outside, a camera 120 configured to capture still images and moving images, and a speaker 130 through which sound is output.

The display device 100 may include the touch panel as described above and a display panel (not shown). The touch panel may be formed on a front surface of the display panel and thus a cover glass 70 may be exposed on a top surface of the display device 100. Alternatively, the display panel may be attached to the touch panel.

The display panel may display an image. The display panel may be a liquid crystal display panel or an organic light-emitting display panel, and may be applied to various products such as a mobile phone, a television (TV), and a navigation device.

Although a display device has been described above as an example of a device to which touch panels according to embodiments of the present invention are applicable, the device is not limited to the display device and may be used in various products such as a keypad, a touch pad for a laptop computer, and a touch input device for a vehicle.

While the structure and features of the present invention have been described above with respect to embodiments of the present invention, it would be apparent to those of ordinary skill in the art that the present invention is not limited thereto and may be changed or modified variously without departing from the idea and scope of the present invention. Accordingly, it should be understood that such changes or modifications fall within the scope of the invention as defined in the appended claims.

The invention claimed is:

1. A conductive sheet comprising a first nano structure and a second nano structure disposed to intersect each other,
wherein a thickness of an intersection region of the first nano structure and the second nano structure is 0.6 to 0.9 times of a sum of thicknesses of a non-intersection region of the first nano structure and the second nano structure.

2. The conductive sheet of claim 1, further comprising a matrix contained the first nano structure and the second nano structure,
wherein the matrix is direct contact with the first nano structure and the second nano structure.

3. The conductive sheet of claim 1, wherein the first nano structure and the second nano structure are electrically connected each other at the intersection region.

4. The conductive sheet of claim 1, wherein the first nano structure and the second nano structure are formed by spinning a mixed solution of a metal material and a polymer,
wherein the intersection region is formed by removing the polymer after spinning the mixed solution.

5. The conductive sheet of claim 1, wherein a width of the intersection region is 1.2 to 1.8 times larger than a width of the non-intersection region.

6. The conductive sheet of claim 1, wherein each of the first nano structure and the second nano structure has an aspect ratio of 100,000 or more.

7. The conductive sheet of claim 1, wherein the first nano structure and the second nano structure are formed by electro-spinning.

8. The conductive sheet of claim 1, wherein the first nano structure has a same cross sectional area in the intersection region and the non-intersection region.

9. A conductive pattern including at least one unit conductive pattern comprising a touch pixel, the conductive pattern comprising:
a first nano structure and a second nano structure disposed to intersect each other in the unit conductive pattern,
wherein a thickness of an intersection region of the first nano structure and the second nano structure is 0.6 to 0.9 times of a sum of thicknesses of a non-intersection region of the first nano structure and the second nano structure.

10. The conductive pattern of claim 9, wherein the first nano structure has a first end and a second end,
wherein the first end meets a first side surface of the conductive pattern at a first point,
wherein the second end meets a second side surface of the conductive pattern at a second point,
wherein a distance of the first point and second point is shorter than a length of the first nano structure.

11. The conductive pattern of claim 10, wherein the first side surface and the second side surface are adjacent each other.

12. The conductive pattern of claim 10, wherein the first side surface and the second side surface are facing each other.

13. The conductive pattern of claim 9, further comprising a matrix contained the first nano structure and the second nano structure,
wherein the matrix is direct contact with the first nano structure and the second nano structure.

14. The conductive pattern of claim 9, wherein the first nano structure and the second nano structure are electrically connected each other at the intersection region.

15. The conductive pattern of claim 9, wherein the first nano structure and the second nano structure are formed by spinning a mixed solution of a metal material and a polymer,
wherein the intersection region is formed by removing the polymer after spinning the mixed solution.

16. The conductive pattern of claim 9, wherein a width of the intersection region is 1.2 to 1.8 times larger than a width of the non-intersection region.

17. The conductive pattern of claim 9, wherein the first nano structure and the second nano structure are formed by electro-spinning.

18. The conductive pattern of claim 9, wherein the first nano structure has a same cross sectional area in the intersection region and the non-intersection region.

19. The conductive pattern of claim 10, wherein the first nano structure meets at least one point with a straight line connecting the first point and the second point.

* * * * *